(12) United States Patent
Naughton

(10) Patent No.: US 6,887,365 B2
(45) Date of Patent: May 3, 2005

(54) NANOTUBE CANTILEVER PROBES FOR NANOSCALE MAGNETIC MICROSCOPY

(75) Inventor: Michael J. Naughton, Norwood, MA (US)

(73) Assignee: Trustees of Boston College, Chestnut Hill, MA (US)

(*) Notice: Subject to any disclaimer, the term of this patent is extended or adjusted under 35 U.S.C. 154(b) by 0 days.

(21) Appl. No.: 10/665,800

(22) Filed: Sep. 18, 2003

(65) Prior Publication Data

US 2004/0113621 A1 Jun. 17, 2004

Related U.S. Application Data

(60) Provisional application No. 60/412,319, filed on Sep. 20, 2002.

(51) Int. Cl.[7] ............................................... C25D 5/18
(52) U.S. Cl. .................................. 205/104; 205/118
(58) Field of Search ......................... 205/104, 118, 205/122, 766; 73/105; 324/300

(56) References Cited

U.S. PATENT DOCUMENTS 6,401,526 B1 * 6/2002 Dai et al. ...................... 73/105
6,528,785 B1    3/2003 Nakayama et al.
6,656,712 B1   12/2003 Balavoine et al.
6,706,402 B2    3/2004 Rueckes et al.
6,737,939 B2 * 5/2004 Hoppe et al. ................ 333/186
6,755,956 B2 * 6/2004 Lee et al. .................... 205/104

* cited by examiner

Primary Examiner—Louis Arana
(74) Attorney, Agent, or Firm—Palmer & Dodge, LLP; Paula Campbell Evans; David J. Dykeman

(57) ABSTRACT

The present invention provides an MFM or MRFM analytical device comprising a micro-dimensional probe that is capable of detecting single proton and single electron spin. Furthermore, it provides an MFM or MRFM device comprising a micro-dimensional probe, that is capable of detecting magnetic structures of size of order one nanometer. In particular, the present invention provides a micro-dimensional probe for an MFM or MRFM device that comprises a CNT cantilever that comprises a nanoscale ferromagnetic material. The CNT cantilever can be attached to an electrode as a component of a microscopic probe which is coupled with an electrical circuit as a component of a device for nanoscale MFM or MRFM micro-dimensional probes. The device comprising the probe and electrical circuit can be incorporated into an existing scanning probe microscope (SPM) apparatus having accommodation for electrical readout.

18 Claims, 4 Drawing Sheets

(a)

(b)

NANOTUBE CANTILEVER PROBES FOR NANOSCALE MAGNETIC MICROSCOPY

RELATED APPLICATION

This application claims the benefit of U.S. Provisional Application No. 60/412,319, filed on Sep. 20, 2002. The entire teachings of the above application are incorporated herein by reference.

GOVERNMENT SUPPORT

The present invention was made with partial support from The National Science Foundation Grant Number 0210533. The United States Government retains certain rights to the invention.

FIELD OF THE INVENTION

The present invention relates to micro-dimensional analytical probes for Magnetic Force Microscopy and Magnetic Resonance Force Microscopy. In particular, the present invention relates to nanoscale materials having piezoelectric properties such as carbon nanotubes (CNTs) with pre-determined morphology that function as electromagnetic analytical probes in a Magnetic Force Microscopy or Magnetic Resonance Force Microscopy device

BACKGROUND OF THE INVENTION

Magnetic Force Microscopy (hereinafter referred to as MFM) and Magnetic Resonance Force Microscopy (hereinafter referred to as MRFM) provide micrometer-scale imaging of magnetic structures and surfaces. In MFM, a ferromagnet-tipped cantilever is brought into close proximity with a sample surface to detect the force between the tip and the sample. The tip is scanned over the surface to reveal the magnetic domain structure of the sample. A typical application of MFM is in data storage technology, such as magnetic disk drives. MRFM is potentially significantly more sensitive than MFM, with capability of providing nanometer-scale three-dimensional (3D) imaging of small structures such as semiconductor quantum dots (e.g., for quantum computing) and biological samples such as cells, proteins and DNA.

MRFM is a combination of Nuclear Magnetic Resonance Imaging (MRI) and Atomic Force Microscopy (AFM). A Magnetic Resonance Force Microscope (MRFM) is a microscopic imaging instrument that mechanically detects magnetic resonance signals by measuring the force between a permanent magnet and spin magnetization. Conventional MRI is able to provide images of muscular tissue, for example, by measuring changes to a voltage induced in a coil inductor when the magnetic spins of the atoms in the tissue are excited by a radio frequency (RF) magnetic field. The RF field is driven at the natural or "resonance" frequency of the spins, causing them to rotate or precess about a strong static magnetic field. The spins in the case of human MRI studies are those of the hydrogen nuclei (protons) in the fat and water in the body (the human body is about $2/3$ hydrogen). The imaging occurs when a gradient, or spatially varying static field is used, such that only a small slice of the specimen is in resonance with the RF field at any given time. The position of this slice is often controllably varied, yielding a position-sensitive measurement of the resonant spin domain (an MRI image). Thus, MRI is based on the absorption and emission of energy in the radio frequency range of the electromagnetic spectrum. The spatial resolution of MRI is about 0.1 millimeter (mm) or perhaps slightly less (10 μm resolution has been achieved in a lab based non-commercial NMR microscope).

AFM is fashioned after the scanning tunneling microscope (STM). AFM has the capability of imaging individual atoms on the surface of a material by measuring the atomic-scale repulsive force between the atoms themselves and the tip of a compliant cantilever, usually made of silicon or silicon-nitride. When brought extremely close to the surface under study (of order 1 nanometer), the interaction forces between the surface and tip cause the cantilever to deflect or bend. This deflection is then measured, usually by reflecting a laser beam off the back of the cantilever and toward a photodiode detector. The AFM can accurately image structures down to the Angstrom scale ($10^{-10}$ m), about a million times smaller than that of MRI.

Both an MFM and an MRFM device typically comprise a small ferromagnet that is attached to the terminal end of an AFM cantilever. This ferromagnet generates an inhomogeneous magnetic field (a gradient field), whereby the magnetic field of the ferromagnet decreases sharply with increasing distance from the cantilever. When a magnetic moment M is exposed to a gradient magnetic field ($\delta B/\delta r$), it experiences a force F equal to the product of the moment and the gradient (F=M $\delta B/\delta r$). If the AFM cantilever with the associated magnetic tip is positioned near the surface of a specimen material containing a plurality of magnetic moments (spins), the possibility exists for those spins to feel the magnetic gradient $\delta B/\delta r$ and thereby the force F. This in turn causes the cantilever to feel an equal and oppositely directed force, causing it to deflect. Thus, the cantilever senses the presence of magnetic spins at and, in the case of MRFM, even beneath the specimen surface.

The relative positions of the cantilever and the specimen may be changed, or scanned, in an MFM or MRFM device, to yield a spatial map of the force F experienced by the cantilever, which translates as a spatial map of the underlying magnetic spin structure of the specimen. In addition to lateral and vertical scanning typical of an AFM device, which provides a topographic map of the surface of a specimen, an MRFM device provides additional provides vertical scan information, resulting in three-dimensional imaging of the specimen with sub-surface capability similar to MRI, but with AFM-scale resolution.

The ultimate spatial and magnetic moment resolutions of both the MFM device and the MRFM device are determined by the magnitude of the magnetic field gradient $\delta B/\delta r$, the mechanical limitations of the cantilever, and the sensitivity of the cantilever motion detector. Smaller physical dimensions of the cantilever are highly desirable to enable imaging of smaller particles such as cells and proteins and DNA. However, the present state of the art detection scheme employs laser light directed at and reflected off the backside of the cantilever, toward a photodetector or interferometer. As the cantilever size decreases, optical detection becomes increasingly difficult, especially when the cantilever dimensions approach or become less than the wavelength of the light in the detector beam. The use of micro-scale cantilevers is a major factor in limiting MFM and especially MRFM resolution in present devices, which is presently at the 10,000 to 100,000 spin level. Micro-dimensional probes that are capable of detecting single proton and single electron spin are therefore, not possible using present cantilevers.

SUMMARY OF THE INVENTION

The present invention provides an MFM or MRFM analytical device comprising a micro-dimensional probe that is capable of detecting single proton and single electron spin. Furthermore, it provides an MFM or MRFM device comprising a micro-dimensional probe, that is capable of detecting magnetic structures of size of order one nanometer. Additionally, the present invention provides micro-dimensional cantilever piezoelectric probes for an MFM or MRFM device. In particular, the present invention provides a micro-dimensional probe for an MFM or MRFM device that comprises a cantilever composed of a carbon nanotube (herein after referred to as CNT cantilever) that comprises a nanoscale ferromagnetic material or "nanomagnet". The CNT cantilever can be attached to an electrode as a component of a microscopic probe which, in turn, is coupled with an electrical circuit as a component of a device for nanoscale MFM or MRFM micro-dimensional probes. The device, comprising the probe and electrical circuit, can be incorporated into an existing scanning probe microscope (hereinafter referred to as SPM) apparatus having accommodation for electrical readout.

Carbon nanotubes (hereinafter referred to as CNTs) offer significant advantages in that they possess piezoelectric properties. The piezoelectric properties allow a means of internally detecting the movement of a cantilever comprised of a CNT. The internal detection method eliminates the need for an external detection method such as the reflection of a laser beam off the cantilever toward a photodiode detector. CNTs also possess substantially higher strength-to-weight ratio and superior mechanical properties over other materials such as silicon. CNTs can have linear or non-linear morphologies. Linear CNTs as defined herein, refers to CNTs that do not contain any branches originating from the surface of individual CNT tubules along their linear axes. Branched CNTs as defined herein, refer to non-linear CNTs with at least one location along the linear tubule axis or at the tubule terminal from which one or more tubules originate, including having linear tubule axes that are non-identical to the tubule from which they originate. Such points of origination of additional tubules (branch points) are also referred to herein as "junctions". Branched CNTs can include, for example, "Y-shaped" CNTs and "V-shaped" CNTs. In one embodiment, the cantilever is a Y-shaped CNT. In another embodiment, the cantilever is a V-shaped CNT. Important structural attributes of CNTs that determine their mechanical and electrical properties can be controlled and "tailored" for specific probe requirements.

Unlike conventional optical-detection based systems such as MFM and MRFM-based detection wherein the measuring device is scanned by conventional means (for example, those employed by typical scanning probe microscopes) near a magnetic surface, the cantilever device of the invention involves the passage of an electric current into and out of (i.e. through) the cantilever, with cantilever tip motion detected via a change in the electrical resistance upon deflection due to the piezoresistive effect. Conventional resistance bridge circuitry is employed to measure the resistance and its change due to cantilever motion. This can be operated in DC (direct current) or AC (alternating current) modes, using conventional constant current amplitude or constant voltage amplitude sources. Certain signal-to-noise advantages are obtained while operating in AC mode, in particular if the measurement (current/voltage) frequency matches the mechanical resonance frequency of the cantilever device.

Detection circuitry may include a Wheatstone bridge operated in AC or DC mode, AC phase sensitive detection using a ratio transformer or a lock-in detector, or DC detection using a constant current source and a sensitive voltmeter. Differential measurements may be employed for increased sensitivity, by sending an electrical current through two nominally identical piezoresistive sensors in series combination, with only one of these sensors being in proximity to the sample surface under investigation.

The present invention also provides methods for fabricating an analytical device and methods for analyzing specimen test samples by nanoscale MFM and by nanoscale MRFM using an analytical device comprising the CNT cantilever probe. Used for MRFM, the CNT probe of the present invention enables three-dimensional magnetic resonance imaging of samples for detection of biological molecules such as DNA, biological cells, and microscopic imperfections such as single impurities in solids, at the molecular/atomic level.

In one aspect, the present invention comprises an MRFM probe that includes a CNT cantilever component. Preferably, the probe comprises a branched CNT cantilever, comprising a ferromagnetic material, that is attached to an electrode. In one embodiment, the branched CNT cantilever is attached to the electrode by at least one of the CNT cantilevers tubules. In a preferred embodiment, the branched CNT cantilever is attached to the electrode by the ends of the top two arms of the branched CNT cantilever, and the bottom third of the cantilever is extended out from the substrate. The branch that is extended out from the substrate is referred to as the cantilevered end. In one embodiment, a ferromagnetic material is attached to the terminus of the cantilevered branch of the CNT cantilever. In another embodiment, the ferromagnetic material is attached to the junction of the CNT cantilever. In another embodiment, the cantilever comprises a terminally capped ferromagnetic layer. Preferably, the ferromagnetic material is a ferromagnetic nanoparticle. The ferromagnetic nanoparticle can act as the MRFM spin probe near a specimen surface.

In another aspect, the present invention contemplates an analytical device comprising a probe comprising a carbon nanotube cantilever, having attached thereto a ferromagnetic material, coupled to an electrode.

Another aspect of the present invention involves a method of detection for nanoscale MRFM using a carbon nanotube cantilever. Readout of the cantilever can be achieved electrically, eliminating the need for optical interferometry or other optical detection methods, which become problematic as cantilever dimensions are reduced to sub-optical-wavelength. The method uses the intrinsic piezoelectric or piezoresistance properties of the carbon nanotubes to provide a readout in the nanoscale MRFM device.

Another aspect of the present invention involves the fabrication and isolation of carbon nanotube cantilevers probes. In one embodiment, multi-walled CNTs are preferred. In another embodiment, the substrate is an electron-beam patterned substrate. The CNT cantilevers can be obtained by growing CNTs on a catalyst-containing substrate surface by a number of known methods, include chemical vapor deposition. CNTs can be grown in arrays. The catalyst containing surface for CNT growth can be patterned on a material surface by conventional lithography so as to produce CNT "nanocircuits". Ferromagnetic material can be attached to the terminus of one of the branches of the cantilever using deposition techniques known in the art. In one embodiment a cobalt nanorod is attached to the cantilever using a polymeric adhesive.

In another embodiment, the ferromagnetic material is attached to the nanotube as a result of nanotube formation, that is, a portion of the (ferromagnetic) catalyst material that nucleates CNT groups remains fixed to the end of the CNT.

Another aspect of the invention involves the fabrication of an electrode comprising CNT cantilever probes of the invention. In one embodiment, the CNTs can be attached to the electrode on a lithographically prepared substrate using SPM manipulation by standard methods known in the art. In another embodiment the CNTs comprised in the probes can be formed directly on the substrate.

Another aspect of the invention comprising the CNT probes is a method of constructing an analytical device for use in nanoscale MRFM.

Another aspect of the invention comprising the CNT probes is a method of analyzing a sample with nanoscale MRFM.

DETAILED DESCRIPTION OF THE INVENTION

Definitions

The term "CVD" refers to chemical vapor deposition. In CVD, gaseous mixtures of chemicals are dissociated at high temperature (for example, $CO_2$ into C and $O_2$). This is the "CV" part of CVD. Some of the liberated molecules can then be deposited on a nearby substrate (the "D" in CVD), with the rest pumped away.

The term "piezoresistance" is defined in the art as a change in resistance in a material, caused by an applied stress. Piezoresistance or piezoelectric properties of CNTs are the variations of the electrical resistance of the CNT due to stress caused by a deflection or bending of at least one end.

The term "ferromagnetic" is afforded the term commonly given in the art. A "ferromagnetic material" is a material having the ability to maintain magnetization in the absence of a magnetic field. Typical ferromagnetic materials comprise elements selected from transition metals of the periodic table and alloys thereof. Preferred ferromagnetic elements are cobalt, iron, nickel, and alloys thereof.

The term "nanomagnet" is defined in the art as a ferromagnetic material having dimensions from about 1 nanometer (nm) to about 10 micrometers.

MRFM Device Comprising a CNT Ferromagnetic Probe

The present invention provides an MRFM analytical device comprising a micro-dimensional probe that is capable of detecting single proton and single electron spin. In particular, the present invention provides a micro-dimensional probe for an MRFM device that comprises a CNT cantilever that includes a ferromagnetic particle. The CNT cantilever can be attached to an electrode as a component of a probe. The probe can be coupled with an electrical circuit as a component of a device for nanoscale MRFM micro-dimensional probes.

Figure 1:
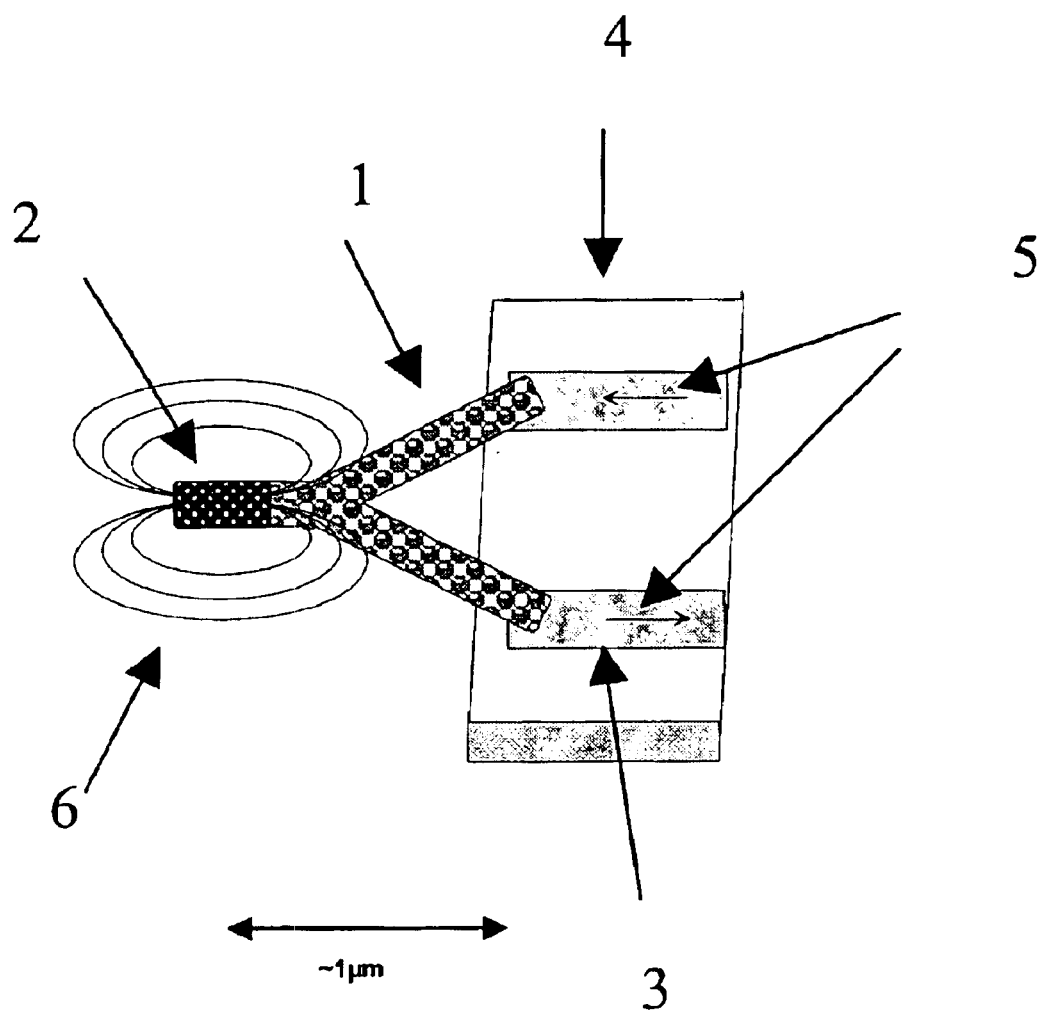
FIG. 1 shows a schematic drawing of an analytical device for use in a nanoscale MRFM containing the CNT cantilever probe of the invention.

FIG. 1 depicts a device of the present invention. Two arms of a branched CNT cantilever 1, are connected to electrodes 3, which are on the surface of substrate 4. A ferromagnetic material 2 is attached to the cantilevered end of CNT cantilever 1. Arrows 5 show the direction of an alternating electrical current flowing thought the device. The gradient field felt by the specimen spins are represented by dashes lines 6.

CNTs are cylinders of networked carbon atoms that can have cylinder diameters as small as about 0.4 nm (1 nm=$10^{-9}$ m). CNTs can be prepared in typical lengths from about 10 nm to about 100,000 nm (0.1 mm) and diameters from about 1 nm and about 100 nm. The smallest diameter CNTs (about 0.4 nm to about 10 nm, typically) are comprised of a single tubule of networked carbon atoms, and are referred to as single-walled carbon nanotubes (hereinafter referred to as SWNTs). CNTs also appear as nested concentric cylinders, referred to as multiwalled carbon nanotubes (hereinafter referred to as MWNTs). For the present invention, preferred dimensions are diameters between about 1 nm and about 50 nm, and lengths between about submicron and about 100 micrometers. In a currently preferred embodiment, the CNT tubules have a length ranging between about 1 micrometer to about 10 micrometers. CNTs have conducting properties depending on chirality (the rotation of the symmetry of carbon network along the cylinder axis). CNTs can be metallic, semiconducting or insulating. Single walled nanotubes can be metallic or semiconducting, depending on chirality, while MWNTs are observed to be only metallic, likely a result of mixed chirality among the carbon layers. Both CNT species are mechanically robust, with a Young's modulus of about 1 TPa ($10^{12}$ Pa).

The sub-micron diameter makes CNTs ideal candidates for the reduced-size, "nanoscale" cantilevers required for MRFM imaging of nanoscale features in samples. Moreover, the small dimensions will lead to increased mechanical resonance frequencies due to the smaller mass (resonance frequency varies inversely with the square root of the mass $f_o \sim 1/m^{1/2}$), a beneficial quality for imaging. CNTs offer significant advantages in that they possess piezoelectric properties. The piezoelectric properties allows the means of internally detecting the movement of a cantilever comprised of a CNT. The means of internally detecting movement eliminates the need for an external detection such as the reflection of a laser beam off the cantilever toward a photodiode detector. CNTs also possess substantially higher strength-to-weight ratio and superior mechanical properties over other materials such as silicon.

Figure 3:
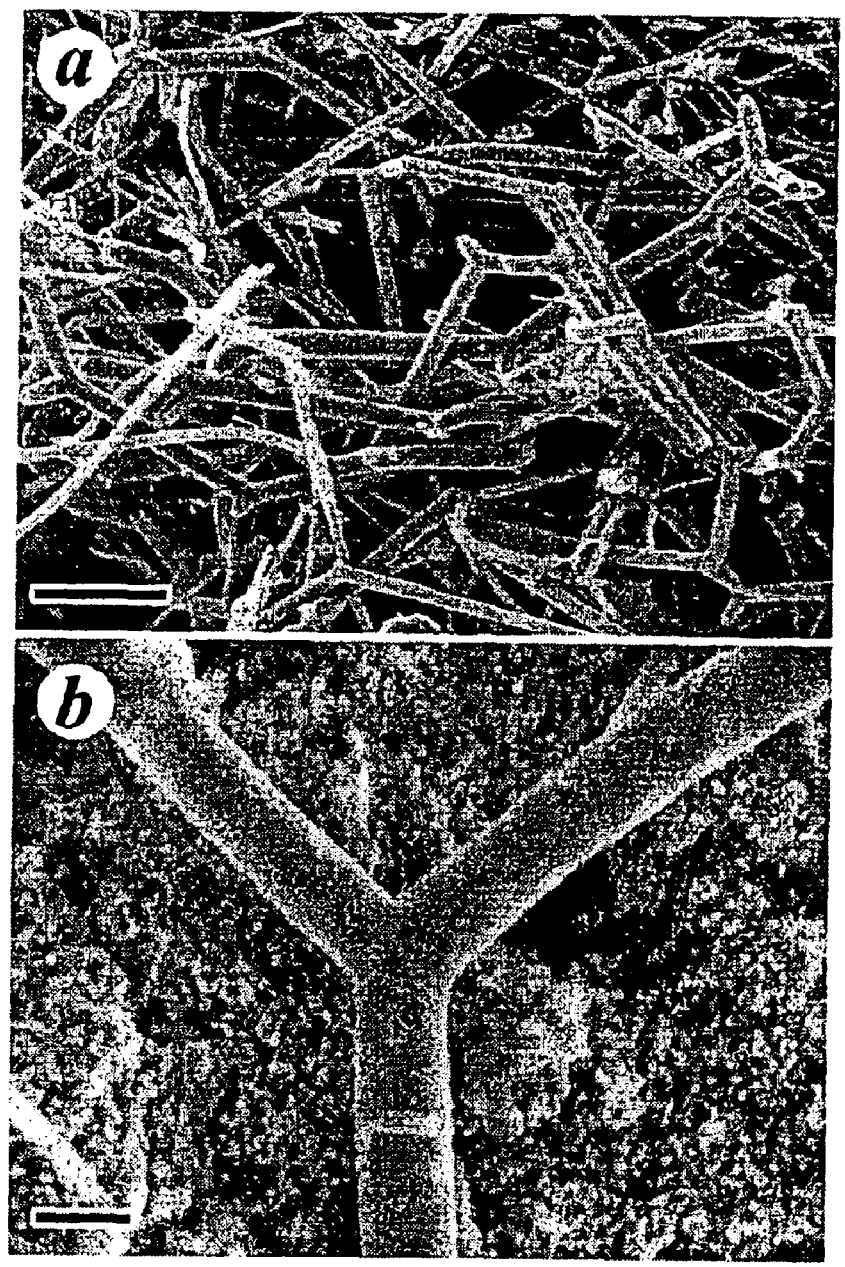
FIG. 3 shows scanning electron microscope (SEM) photomicrographs of symmetrically branched (Y-shaped) CNTs at (a) low magnification (scale bar=1 $\mu$m) and (b) high magnification (scale bar=200 nm).
Figure 4:
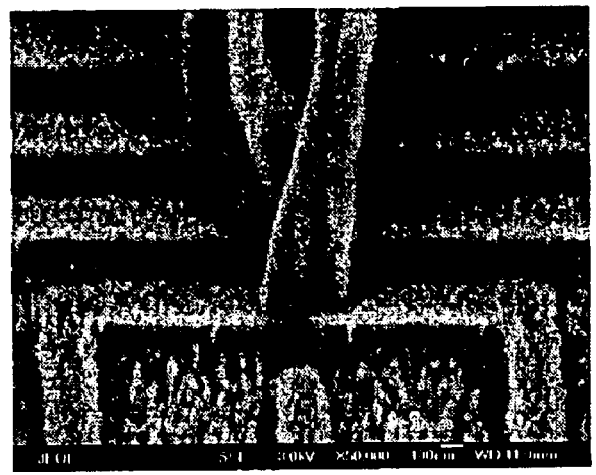
FIG. 4a shows an SEM image of about 100 nm diameter multi-walled CNTs grown by a CVD process on nanolithographically prepared silicon substrates.
FIG. 4b shows an AFM photomicrograph of tungsten wires on silicon-nitride on a silicon wafer surface.
Figure 4:
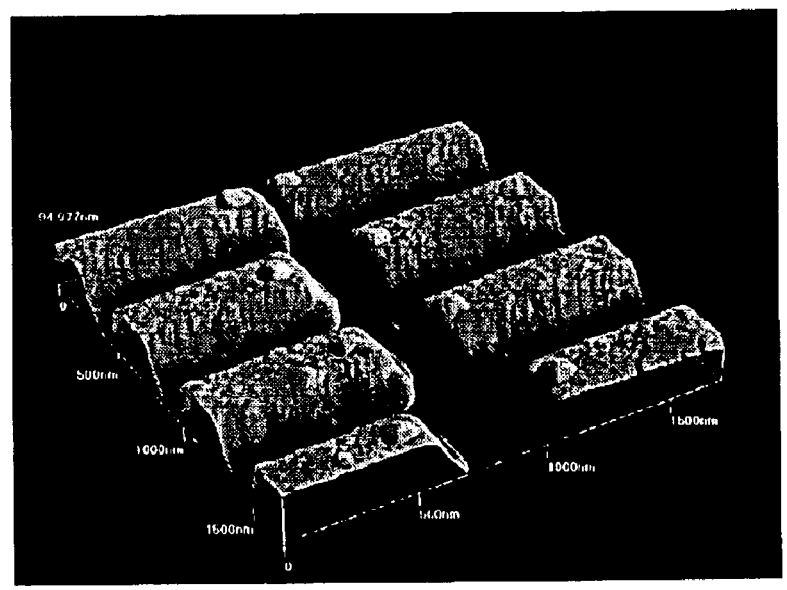

CNTs can be linear or non-linear. "Linear CNTs" as defined herein, refer to CNTs that do not contain any branches originating from the surface of individual CNT tubules along their linear axes. "Branched CNTs" as defined herein, refer to non-linear CNTs with at least one location along the linear tubule axis or at the tubule terminal from which one or more tubules originate, having linear tubule axes that are non-identical to the tubule from which they originate. Such points of origination of additional tubules (branch points) are also referred to herein as "junctions". Branched CNTs include, for example, "Y-shaped" CNTs and "V-shaped" CNTs. The individual arms constituting branched tubules are either symmetrical or unsymmetrical with respect to both arm lengths and the angle between adjacent arms. In one embodiment, the individual arms are between about 1 nm and about 100 micrometers in length. FIG. 3 shows example images of Y-shaped CNTs. In one embodiment of the present invention, the probe comprises a CNT which is Y-shaped. The Y-shaped CNTs exist as (1) a plurality of free standing, branched CNTs attached to the substrate and extending outwardly from the substrate outer surface; and (2) one or more CNTs with a branched morphology wherein the CNT tubule structures have Y-junctions with nominally straight tubular arms and nominally fixed angles between said arms. In another embodiment of the present invention, the probe comprises a CNT cantilever which is V-shaped. FIG. 4a shows images of V-shaped CNTs. Important structural attributes of CNTs that determine their mechanical and electrical properties can be controlled and "tailored" for specific requirements.

The ferromagnetic particle of the present invention comprises a ferromagnetic material. Typical ferromagnetic materials comprise elements selected from transition metals of the periodic table and alloys thereof. Preferred ferromagnetic elements are cobalt, iron, nickel, and alloys thereof. In one embodiment, the ferromagnetic particle is in the form of a nanorod, with preferred length about 10 nm to about 100 nm, and preferred length to diameter ratio of about 2 to about 100.

Cantilever Probe Fabrication

Figure 2:
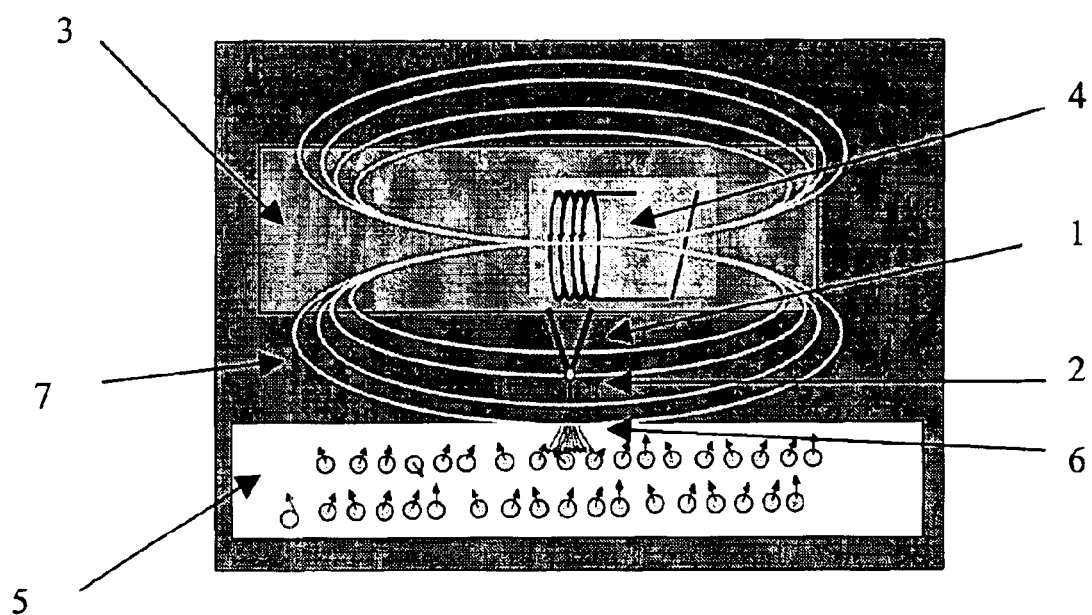
FIG. 2 shows a schematic drawing of an MRFM layout of the analytical device with a CNT cantilever probe.

The invention provides methods for fabricating an analytical device comprising a CNT cantilever probe. FIGS. 1 and 2 show the assembly of the components comprised in the MRFM analytical device. For an MRFM application, the nanotube is positioned as follows: immobilizing two arms of a Y to two electrodes on a substrate, with the third arm cantilevered out from the substrate edge, as depicted in FIGS. 1 and 2. FIG. 2 depicts the full MRFM layout of the device in which the CNT cantilever 1 is cantilevered out from the substrate 3, and a ferromagnetic material 2 is attached to the free arm of the CNT cantilever 1. The gradient field 6 is felt by sample spins 5. An RF coil is represented as a microcoil 4 integrated into the substrate 3 and produces an RF magnetic field 7.

Branched CNT cantilevers are attached to or grown onto lithographically prepared substrates containing surface metal electrodes. In a preferred embodiment, the substrate comprises on-chip signal processing capabilities.

The Y-shaped CNTs are used as an MRFM cantilever by attaching the ends of the top two arms of the Y to a substrate, with the bottom, third arm cantilevered out over the edge of the substrate. Examples of Y-shaped carbon nanotube are shown in FIG. 3.

The V-shaped CNTs are used as an MRFM cantilever by attaching the arms of the V to a substrate, with the junction cantilevered out over the edge of the substrate. Examples of V-shaped carbon nanotube are shown in FIG. 4a.

Y-shaped and V-shaped CNTs are placed on a substrate using Scanning Probe Microscopy (SPM) manipulation techniques which are known in the art. They can be situated to protrude perpendicularly from the substrate, or can lie parallel to the substrate at a substrate edge, such that the device cantilevers out from the edge.

Connection of the CNT cantilever to a substrate, such as for example silicon, may be accomplished in the following ways: namely, device-on-electrodes, and electrodes-on-device. In the former, device-on-electrodes configuration, metallic lead electrodes are deposited by conventional lithographic techniques, possibly including electron-beam lithography, onto a passivated semiconductor substrate (e.g. silicon dioxide or silicon nitride, on silicon). These electrodes are of appropriate thickness, width, length and proximity for later attachment of CNT cantilevers. In one aspect, preferred electrode dimensions are thickness of about 100 nm, width of about 100 nm, length of up to several millimeters (in one embodiment, length of about 1 mm), and proximity (distance between two planar electrodes) of about 100 nm. The substrate may be prepared with vertical void regions, or edges, with the above electrodes deposited to the edges. CNT cantilevers may then be placed onto the substrate, such as by dispersion of CNTs in solution which is then evaporated, and physically manipulated into place atop the prepared electrodes. One end of a "Y" or the joint of the "V" would be cantilevered out over the substrate edge, or over the void area, forming a cantilever. Additional electrical contact of the fixed ends of the "V" or "Y" CNT to the surface metallic electrodes could be achieved by electrodeposition, electroless deposition, or electron beam "welding" in a scanning electron microscope (SEM).

For the latter electrodes-on-device configuration, the CNT cantilever is situated on the substrate prior to metal electrode deposition. In a similar fashion to the former device-on-electrodes configuration, the CNT is manipulated with an SPM into position, forming a cantilever. The planar coordinates of the final location of the CNT can be identified with an SEM or an SPM. These coordinates are then later used to program a photolithographic or electron beam lithographic system to accurately place metallic electrodes onto a surface and overlapping the ends of the fixed portions of the CNTs, making electrical contact. Another aspect of preparation of the electrodes-on-device configuration involves a Y or V-shaped CNT situated flat on a substrate. Photolithographic techniques known to the art are then used to both accurately place metallic electrodes overlapping the ends of the Y or V-shaped CNT, and to etch the substrate so as to remove substrate material below a portion of the CNT, facilitating a cantilevered arrangement.

An advantage of using V-shaped CNTs is the ability to grow the CNT cantilevers directly on the substrate, without the added step of attaching a pre-formed CNT cantilever to the substrate. V-shaped carbon nanotube devices can be formed by growing two nanotubes in precise, close proximity (typically from about 10 nm to about 100 nm) using nanoscale electron-beam lithography, and attaching a ferromagnetic particle to their juncture.

FIG. 4b shows an AFM image of tungsten wires on silicon-nitride on a silicon wafer surface. The bumps visible at the ends of each wire are nickel nanodots situated to serve as catalyst sites for subsequent growth of CNTs. Referring to FIGS. 4a and 4b, closely spaced nanotubes can be brought into contact electrostatically, and then attaching, by for example electro less deposition, a ferromagnetic nanoparticle to their juncture. The resulting V-shaped device can then be excited electromagnetically (Lorentz force) into mechanical resonance, for MRFM detection.

Nanomagnetic Incorporated CNT Probes

CNTs' with pre-determined morphology, such as for example, Y-shaped CNTs, can be synthesized using a variety of methods known in the art. Preferred processes for producing quantities of CNTs having varied morphology, including Y-shaped CNTs, are described in W. Z. Li, et al. *Applied Physics Letters*, Volume 79 (12), 2001, Pages 1879 –1881, and J. Li, et al. *Applied Physics Letters*, Volume 75 (3), 1999, Pages 367 –369, which are incorporated herein by reference in their entirety.

As shown in FIG. 3, branched CNTs typically comprise a plurality of Y-junctions with substantially straight arms extending linearly from said junctions. The majority of branched CNTs possess Y-junctions having two long arms that are a few microns long (about 2 to about 10 $\mu$m), and a third arm that is shorter (about 0.01 to about 2 $\mu$m). CNTs with Y-junctions comprising three long arms (up to about 10 $\mu$m), and with multiple branching forming multiple Y-junctions with substantially linear, straight arms can be also obtained by the method of the invention. A high magnification SEM micrograph (FIG. 3b) shows that branched CNTs typically possess Y-junctions that have a smooth surface and uniform tubule diameter about 200 nm. The angles between adjacent arms are close to about 120°, thereby resulting in branched CNTs that have a substantially symmetric structure. All Y-junctions have a substantially similar structural configuration, regardless of their varying tubule diameters.

The CNTs comprised in the probes of the present invention can be synthesized in addressable arrays. Fabrication of addressable CNT arrays utilizes both micro- and nano-lithographic preparation of CNT catalyst sites and metallic addressing wires on single crystal silicon wafers. Subsequently, growth of aligned CNTs on the catalyst surface is accomplished via CVD. Essentially, a series of thin gold wires are defined lithographically on the surface of the silicon wafer, wherein the inner ends of pairs of individual wires are in close proximity, for example, about 100 nm. A CNT growth catalyst (for example, nickel (Ni) or cobalt (Co)) nanodot site is defined at these proximal ends using e-beam lithography, following which the catalyst material is deposited. The wafers are then placed in a chemical vapor deposition (CVD) chamber to initiate CNT growth. CNT growth occurs only at the catalyst nucleation sites.

The fabrication schemes for MRFM probes of the present invention rely on the use of a nanomagnet such as a ferromagnetic material as the field sensor. In one embodiment a ferromagnetic material can be attached to the branched CNT cantilever of the present invention post-synthesis using typical deposition techniques known in the art (e.g., CVD, and electroless deposition). In another embodiment, the ferromagnetic material is incorporated onto the CNT cantilever as a result of in situ nanotube formation.

In one aspect, the nanomagnet material in the tubule ends of the CNT cantilever probes of the present invention are generated in-situ during the CNT synthesis. In one embodiment, the catalytic material used in the tubule synthesis comprises a ferromagnetic material that is retained at the tubule ends of the branched CNTs upon synthesis, thereby functioning as "in-situ deposited" nanomagnets in the CNT probe of the invention. Preferred metal catalysts include the metallic materials, including their mixtures and alloys that have ferromagnetic properties. Preferred transition metals include iron, cobalt and nickel, including mixtures and alloys thereof. In a currently preferred embodiment, the transition metal is cobalt. For the in-situ incorporation of the nanomagnet material on the CNT probes of the invention, the catalytic material comprising at least one transition metal or transition metal alloy that is deposited on or impregnated within a support substrate comprising a metallic material or a non-metallic material, such as for example, a non-metallic oxide as microparticles. The catalyst microparticles nucleate the tubule growth in the CNT growth process, whereby they migrate towards the growing ends of the branched CNT tubules and aggregate to form a nanomagnet. The non-metallic oxide comprising the catalytic substrate can be either a transition or a non-transition metallic oxide, or a non-metallic inorganic oxide. Metallic oxides useful in the catalyst materials include, for example, oxides of beryllium, magnesium, calcium, strontium and barium. Preferred metallic oxides include magnesium oxide and calcium oxide. In a currently preferred embodiment, the metallic oxide is magnesium oxide (MgO). The CNT growth process can be controlled to obtain tubules of approximately uniform dimensions within arrays. Depending on growth conditions (which in turn, are influenced by the catalyst material), individual tubules in an array can vary in height between about 10% to about 50% in any given growth run. Important parameters in the growth process of the CNT probe component of the present invention can be varied to include the separation distance between catalytic sites on the substrate (and therefore, between tubule pairs, and tubule branches), and the dimension (diameter and height) of the catalyst microparticles that nucleates the tubule growth and the catalyst deposition method thereby providing control over the size of the nanomagnet growth in situ. Control of the CNT growth process can be utilized to obtain CNT probes of the invention comprising in-situ generated nanomagnets and multi-walled CNTs with tubule diameters that are controllable down to about 100 nm. CNT probes with smaller tubule sizes can be obtained by using aligned CNT arrays of single-walled nanotubes.

The nanotube structure can be driven into mechanical resonance with a Lorentz force, obtained with the use of a static polarizing field oriented in the plane of the "Y" or "V", crossed by an alternating current passing through the two anchored arms of the structure, as in FIG. 2. A ferromagnetic material fixed to the CNT cantilever serves as both the generator of a strong magnetic field gradient to be felt by the spin system to be analyzed (see, for example, FIG. 2), and as the active magnetic sensor which feels the reaction force applied by this spin system. In the usual SPM manner, this MRFM detector can be x-y-z scanned to facilitate 3D imaging of the sample.

The two fixed arms of the branched CNT cantilever may be attached to metallic electrodes, and an electric current can be sent into one arm and out the other, as in FIG. 1. As the cantilevered end of the branched assembly moves under the influence of magnetic forces, a strain-induced change in the electrical resistance of the assembly is measured.

The special shape of the branched CNT structures facilitates direct electrical resistance measurements, with nanotube cantilever deflection causing resistance changes via the piezoresistance effect, measured through the two attached arms of the branched CNT cantilever.

The conducting, and piezoconducting, properties of these multi-walled CNTs are sensitive to defects, over which there is some degree of control in the growing stage. The defect sensitivity can be beneficial. In addition to piezoresistance, the branched CNT can exhibit nonlinear rectifying characteristics, such as for example, in a diode, such that the strain dependent conductivity of the nanotube can be incorporated into a nanoscale amplifying circuit such as for example, a FET, dramatically enhancing the sensitivity to motion. Diodic behavior at room temperature is observed by both STM studies and direct transport across large arrays. Thus, in addition to using piezoresistance to detect the branched CNT cantilever motion, a related detection method could integrate the structure into a nanoelectronic transistor circuit, with potential for significant gains in sensitivity.

The present invention has several advantages. The invention directly overcomes one of the main disadvantages to observation at the molecular level using cantilevers, that of output signal. The method of the present invention uses piezoelectric detection with CNT cantilevers, thereby eliminating the need for laser interferometry mirrored-light detection as required by silicon-based cantilevers. CNTs are known in the art to be high strength, mechanically robust, flexible conducting materials. The use of CNTs as cantilevers in place of silicon-based cantilevers in MRFM, improves the state-of-the-art technology from micrometer-scale resolution by orders of magnitude to nanometer-scale resolution. Nanotubes improve sensitivity and spatial resolution up to about 1,000 times more than possible with silicon-based cantilevers. CNT cantilevers are compatible with conventional technologies for fabricating electrically conducting nanocircuits, such as etched trenches in silicon or surface deposition of thick nanowire contacts. Nanotube cantilevers can be used in inconvenient environments such as biological media. The disclosed devices have the capability of being built in array form, allowing real-time, correlative spectroscopy and imaging. Spatially and temporally correlated detection, in the spirit of functional MRI are possible. The present invention is a unique and enabling technology that has the revolutionary capability to fabricate arrays of ultra-sensitive MRFM devises that can be used for fast imaging. The present invention advances the measurement capabilities of magnetic detection by reducing the size of the measurement tools to the nanoscale. Instead of micromachining silicon down to the appropriate size, the present invention uses CNTs.

The present invention provides new technologies for constructing MRFM instruments that out perform the current generation of MRFM instruments by several orders of magnitude in sensitivity and resolution. CNTs will enable three-dimensional magnetic resonance imaging of samples such as single impurities in solids, biological cells and biological molecules such as DNA at the molecular level.

The devices of the invention, including mechanical and chemical processes for their preparation, as well as methods for their fabrication will become apparent to one familiar in the art based on the aforementioned embodiments and the following non-limiting examples.

EXAMPLES

Example 1

Preparation of Catalyst Substrate for Synthesis of Linear CNTs

Mesoporous silica containing iron nanoparticles were prepared by a sol-gel process by hydrolysis of tetraethoxysilane (TEOS) in the presence of iron nitrate in aqueous solution following the method described by Li et al. (*Science*, (1996), *Vol.* 274,1701 −3) with the following modification. The catalyst gel was dried to remove excess water and solvents and calcined for 10 hours at 450° C. and $10^{-2}$ torr to give a silica network with substantially uniform pores containing iron oxide nanoparticles that are distributed within. The catalyst gel is then ground into a fine, microparticulate powder either mechanically using a ball mill or manually with a pestle and mortar. The ground catalyst particles provide particle sizes that range between 0.1 and 100 $\mu$M under the grinding conditions.

Example 2

Preparation of Catalyst Substrate for Synthesis of Branched CNTs

Catalyst substrates were prepared following the method described by Li et al. (*Applied Physics Letters* (2001) *Vol.* 79(12), 1879-1881). Magnesium oxide (MgO) supported cobalt (Co) catalysts were prepared by dissolving 0.246 g of cobalt nitrate hexahydrate ($Co(NO_3)_2 \cdot 6H_2O$, 98%) in 40 ml ethyl alcohol, following immersing 2 g of particulate MgO powder (−325 mesh) were added to the solution with sonication for 50 minutes. The solid residue was filtered, dried and calcined at 130° C. for 14 hours.

Example 3

General Synthetic Procedure for Branched CNTs

The MgO supported cobalt catalyst of Example 2 were first reduced at 1000° C. for 1 hour in a pyrolytic chamber under a flow of a mixture hydrogen (40 sccm) and nitrogen (100 sccm) at a pressure of 200 Torr. The nitrogen gas was subsequently replaced with methane (10 sccm) to initiate CNT growth. The optimum reaction time for producing branched CNTs was 1 hour.

Example 4

Characterization of CNT Morphology and Purity by Scanning Electron Microscopy (SEM), and Tubule Structure and Diameter by Transmission Electron Microscopy (TEM)

Scanning electron microscopy (SEM) for characterization and verification of CNT morphology and purity was performed on a JEOL JSM-6340F spectrophotometer that was equipped with an energy dispersive x-ray (EDS) accessory. Standard sample preparation and analytical methods were used for the SEM characterization using a JEOL JSM-6340F microscope. SEM micrographs of appropriate magnification were obtained to verify tubule morphology, distribution and purity.

Transmission electron microscopy (TEM) to characterize individual tubule structure and diameter of the CNTs was performed on a JEOL 2010 TEM microscope. Sample specimens for TEM analysis were prepared by mild grinding the CNTs in anhydrous ethanol. A few drops of the ground suspension were placed on a micro-grid covered with a perforated carbon thin film. Analysis was carried out on a JEOL 2010 microscope. TEM micrographs of appropriate magnification were obtained for determination of tubule structure and diameter.

Example 5

Controllable Creation of Arrays of Addressable Multi-walled Carbon Nanotubes

CNTs are grown by the plasma-enhanced hot filament chemical vapor deposition method, including on an e-beam patterned substrate. Metallic nickel, deposited via e-beam lithography over a non-catalytic metal provides the electrical leads, is used as the catalyst for CNT growth.

Example 6

Microdimensional Electrically Addressable Probe Fabrication

Catalyst Deposition on Substrate

The preliminary step in probe fabrication involves a micro- and nanolithographic preparation of CNT catalyst sites and metallic addressing wires on single crystal silicon wafers. Conventional e-beam evaporation of nickel (Ni) or cobalt (Co) is used after an e-bean lithography step is performed on the substrate to define the catalyst sites in an e-beam resist. This is followed by a lift-off step (of the unwanted catalyst material), leaving only the Ni or Co nanodots on top of the gold leads. Alternatively, a self-assembly of catalyst nano-particles from a catalyst-containing solution is used, which precludes the need for the lift-off step. In either case, at the end of this phase, electrically addressable pairs of CNTs with well-defined heights and lateral separations are prepared. Separations between nanotubes down to 10 nm, can be obtained reproducibly by these methods.

Fabrication of Electrically-addressable Carbon Nanotube Arrays

An array of aligned CNTs are grown on the substrate containing catalytic sites via hot filament, plasma-enhanced chemical vapor deposition (PECVD). A series of thin gold wires lithographically on the silicon is defined, with the inner ends of pairs of individual wires in very close proximity (about 100 nm). At these proximal ends, a CNT growth catalyst (for example, Ni or Co) nanodot site is defined using e-beam lithography, and the catalyst material deposited. This wafer is then placed in the CVD chamber, with subsequent CNT growth occurring only at the catalyst nucleation sites. At this point the gold wires may be passivated using electropolymerization. If deemed necessary, additional steps can be introduced to obtain strictly uniform height of the CNTs in the arrays. Depending on growth conditions used, CNTs height in an array in a given growth run can be varied in height by 10%-50%. Height uniformity is accomplished by performing additional mechanical polish steps.

All patents, patent applications, and published references cited herein are hereby incorporated by reference in their entirety. While this invention has been particularly shown and described with references to preferred embodiments thereof, it will be understood by those skilled in the art that various changes in form and details may be made therein without departing from the scope of the invention encompassed by the appended claims.

What is claimed is:

1. A micro-dimensional probe comprising:
   a) an electrode pair attached to a substrate material;
   b) a branched nanotube cantilever comprising:
      i) at least one ferromagnetic material; and
      ii) at least two tubules attached to the electrode pair; and
   c) an electrical circuit coupling the electrode pair to a probe component.

2. The micro-dimensional probe of claim 1, wherein the branched nanotube cantilever exhibits piezoresistance.

3. The micro-dimensional probe of claim 1, wherein the branched carbon nanotube cantilever has a Y-shaped or V-shaped morphology.

4. The micro-dimensional probe of claim 3, wherein the Y-shaped or V-shaped morphology comprises a tubules having a length ranging between 0.1 micrometer and 100 micrometers.

5. The micro-dimensional probe of claim 3, wherein the Y-shaped or V-shaped morphology comprises a tubules having a length ranging between 1 micrometer and 10 micrometers.

6. The micro-dimensional probe of claim 1, wherein the branched carbon nanotube cantilever has a multi-walled morphology.

7. The micro-dimensional probe of claim 1, wherein the tubules have a diameter ranging between 1 nanometer and 100 nanometers.

8. The micro-dimensional probe of claim 1, wherein the tubules have a diameter ranging between 1 nanometer and 50 nanometers.

9. The micro-dimensional probe of claim 1, wherein the ferromagnetic material comprises at least one transition metal.

10. The micro-dimensional probe of claim 9, wherein the transition metal is selected form the group consisting of iron, cobalt, nickel and combinations and alloys thereof.

11. The micro-dimensional probe of claim 1, that is part of a microscopic imaging device.

12. The micro-dimensional probe of claim 11, having a nanoscale dimension.

13. The micro-dimensional probe of claim 12, wherein the microscopic imaging device is an MFM or MRFM device.

14. The micro-dimensional robe of claim 13, that provides detection with nanoscale resolution.

15. A method of sensing or manipulating a microscopic environment or structure using the micro-dimensional probe of claim 1, comprising:
   a) passage of an electric current through the micro-dimensional probe; and
   b) detecting a cantilever tip motion generated by the electric current passage through the micro-dimensional probe by measuring a change in piezoresistance upon deflection from the surface of a sample.

16. The micro-dimensional probe of claim 1 comprising a plurality of branched carbon nanotube cantilevers arranged in an array.

17. The microdimensional probe of claim 1 wherein the branched nanotube cantilever is a branched carbon nanotube cantilever.

18. The microdimensional probe of claim 1 wherein the ferromagnetic is a material is a magnetic sensor material.

* * * * *

UNITED STATES PATENT AND TRADEMARK OFFICE
CERTIFICATE OF CORRECTION

PATENT NO. : 6,887,365 B2  Page 1 of 1
DATED : May 3, 2005
INVENTOR(S) : Naughton, Michael J.

It is certified that error appears in the above-identified patent and that said Letters Patent is hereby corrected as shown below:

Column 13,
Line 46, the "a" after "comprises" should be deleted, so it reads "comprises tubules", not "comprises a tubules".

Column 14,
Line 2, the "a" after "comprises" should be deleted, so it reads "comprises tubules", not "comprises a tubules".
Line 27, should read -- micro-dimensional probe -- not "micro-dimensional robe".

Signed and Sealed this

Fifth Day of July, 2005

JON W. DUDAS
*Director of the United States Patent and Trademark Office*